United States Patent [19]

Anschel et al.

[11] Patent Number: 5,420,520

[45] Date of Patent: May 30, 1995

[54] METHOD AND APPARATUS FOR TESTING OF INTEGRATED CIRCUIT CHIPS

[75] Inventors: Morris Anschel, Wappingers Falls; Anthony P. Ingraham, Endicott; Charles R. Lamb, Endwell; Michael D. Lowell, Endicott; Voya R. Markovich, Endwell; Wolfgang Mayr, Poughkeepsie; Richard G. Murphy, Binghamton; Mark V. Pierson, Binghamton; Tamar A. Powers, Endicott, all of N.Y.; Timothy S. Reny, Underhill Center, Vt.; Scott D. Reynolds, Endwell; Bahgat G. Sammakia, Newark Valley, both of N.Y.; Wayne R. Storr, Great Bend, Pa.

[73] Assignee: International Business Machines Corporation, Armonk, N.Y.

[21] Appl. No.: 76,069

[22] Filed: Jun. 11, 1993

[51] Int. Cl.6 .................. G01R 1/073; G01R 31/02
[52] U.S. Cl. ........................... 324/754; 324/760
[58] Field of Search ............ 324/158 F, 158 P, 754, 324/756, 757, 760; 437/8

[56] References Cited

U.S. PATENT DOCUMENTS

| | | | |
|---|---|---|---|
| 3,806,800 | 4/1974 | Bove et al. | 324/158 P |
| 3,969,813 | 7/1976 | Minetti | 437/250 |
| 4,295,596 | 10/1981 | Doten et al. | 228/180.21 |
| 4,328,286 | 5/1982 | Crosby | 428/636 |
| 4,552,300 | 11/1985 | Zovko et al. | 228/20.5 |
| 4,586,252 | 5/1986 | Faticanti | 29/762 |
| 4,752,025 | 6/1988 | Stack et al. | 228/9 |
| 4,813,589 | 3/1989 | Palmer et al. | 228/119 |
| 4,884,027 | 11/1989 | Holderfield et al. | 324/158 P |
| 4,979,287 | 12/1990 | Schwab et al. | 29/764 |
| 5,118,299 | 6/1992 | Burns et al. | 439/74 |
| 5,137,461 | 8/1992 | Bindra et al. | 439/74 |
| 5,173,451 | 12/1992 | Kinsman et al. | 324/158 F |
| 5,237,269 | 8/1993 | Aimi et al. | 324/158 F |

Primary Examiner—Ernest F. Karlsen
Attorney, Agent, or Firm—Richard M. Goldman

[57] ABSTRACT

A method of testing semi-conductor chips is disclosed. The individual semiconductor chips have I/O, power, and ground contacts. In the method of the invention a chip test fixture system is provided. The chip test fixture system has contacts corresponding to the contacts on the semiconductor chip. The carrier contacts have dendritic surfaces. The chip contacts are brought into electrically conductive contact with the conductor pads on the chip test fixture system. Test signal input vectors are applied to the inputs of the semiconductor chip, and output signal vectors are recovered from the semiconductor chip. After testing the chip is removed from the substrate.

3 Claims, 9 Drawing Sheets

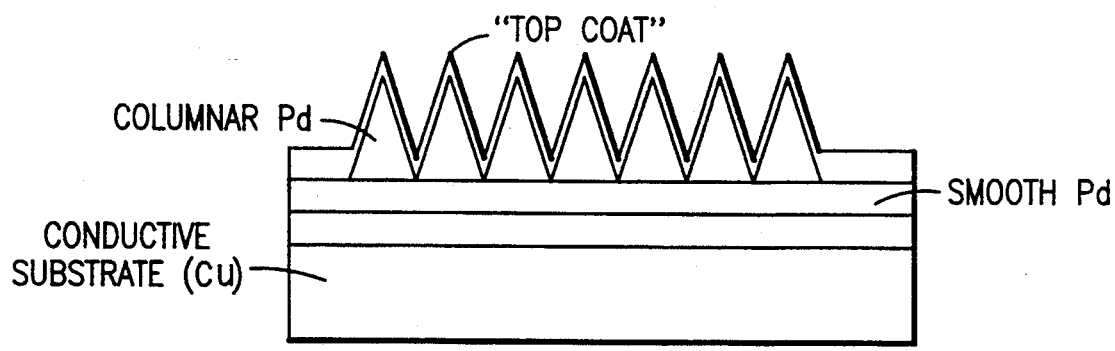

FIG.1

```
┌─────────────────────────────────┐
│ BRING A SEMICONDUCTOR INTEGRATED│
│ CIRCUIT CHIP HAVING A FIRST SET │
│ OF ELECTRICAL CONTACTS INTO     │
│ ELECTRICALLY CONDUCTIVE CONTACT │
│ WITH A BURN IN BOARD CHIP TESTER│
│ HAVING A SECOND SET OF          │
│ ELECTRICAL CONTACTS             │
└─────────────────────────────────┘
                 ⇩
┌─────────────────────────────────┐
│ APPLY A COMPRESSIVE FORCE TO THE│
│ CHIP TO FORCE LOW IMPEDANCE     │
│ CONTACT BETWEEN THE FIRST SET OF│
│ CONTACTS ON THE CHIP AND THE    │
│ SECOND SET OF CONTACTS ON THE   │
│ BURN IN BOARD CHIP TESTER       │
└─────────────────────────────────┘
                 ⇩
┌─────────────────────────────────┐
│ PASS TEST SIGNAL INPUT VECTORS  │
│ TO THE SEMICONDUCTOR CHIP AND   │
│ RECEIVE TEST SIGNAL OUTPUT      │
│ VECTORS FROM THE CHIP           │
└─────────────────────────────────┘
                 ⇩
┌─────────────────────────────────┐
│ APPLY A VACUUM TO THE SURFACE OF│
│ THE CHIP REMOTE FROM THE BURN IN│
│ BOARD TESTER AND A POSITIVE     │
│ PRESSURE BETWEEN THE BURN IN    │
│ BOARD TESTER AND THE CHIP TO    │
│ REMOVE THE CHIP FROM THE BURN IN│
│ BOARD TESTER                    │
└─────────────────────────────────┘
                 ⇩
┌─────────────────────────────────┐
│ SEPARATE CHIPS THAT HAVE PASSED │
│ FROM CHIPS THAT HAVE FAILED     │
└─────────────────────────────────┘
```

FIG.2

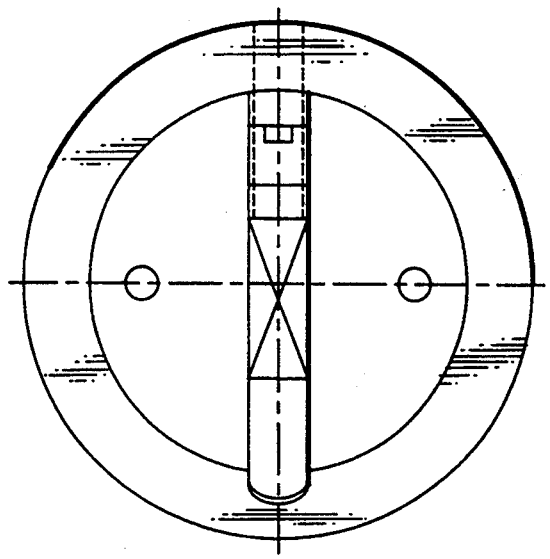
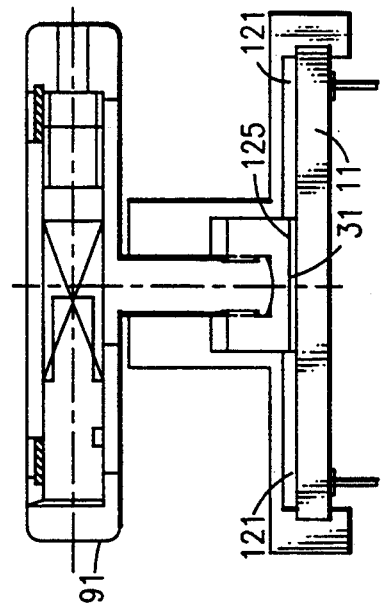
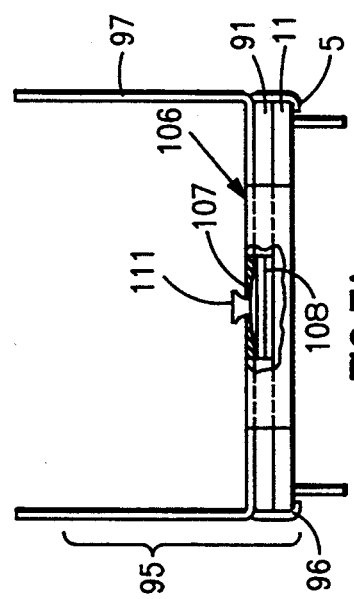
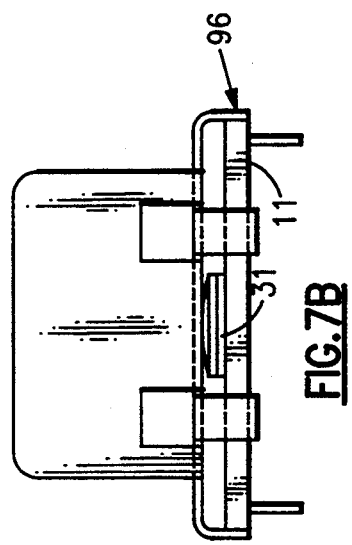

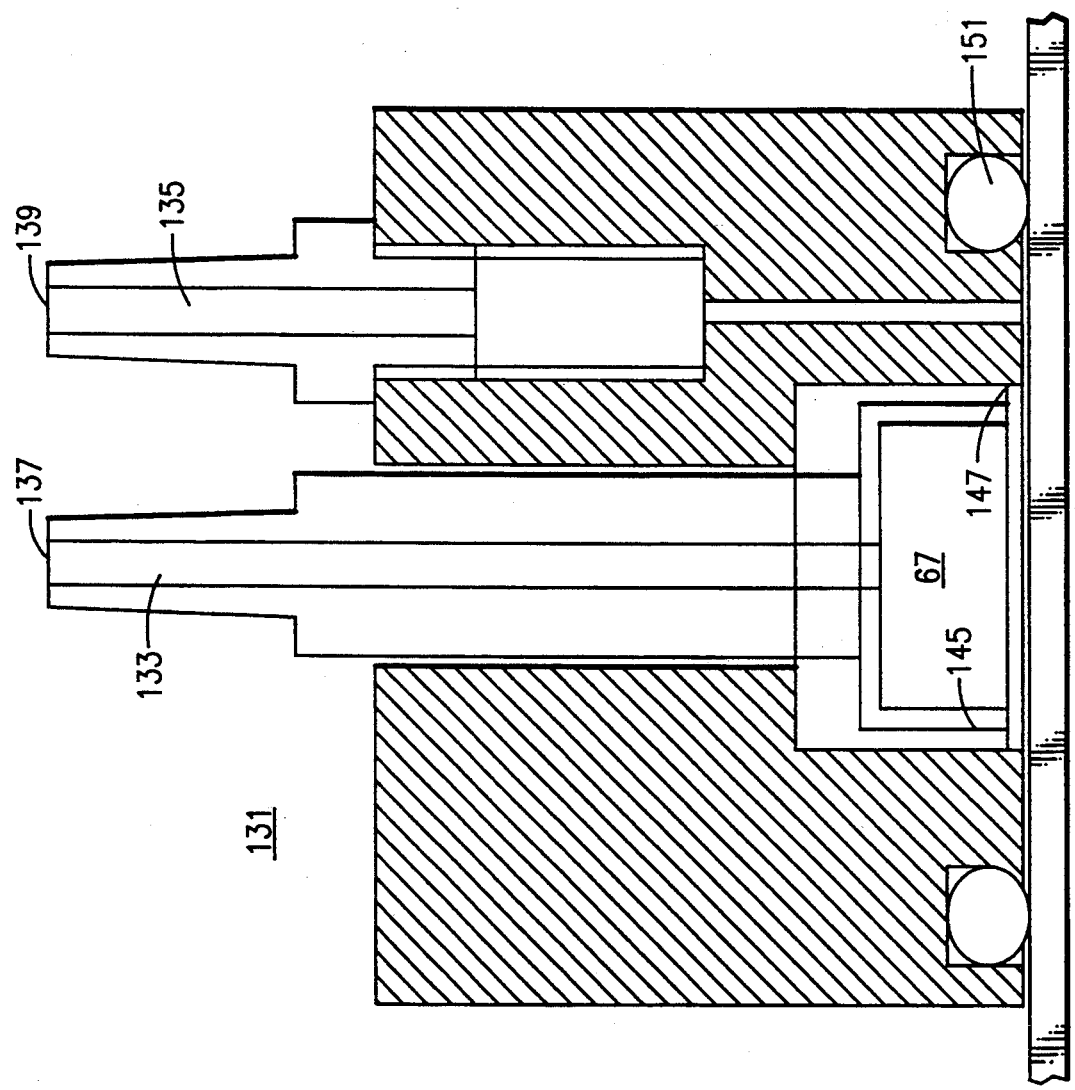

PASSIVE FAULT A=B=C=D=0=>E=0

PULSED CURRENT

CURRENT REVERSAL

ACTIVE FAULT D ↑=>E ↑

METHOD AND APPARATUS FOR TESTING OF INTEGRATED CIRCUIT CHIPS

FIELD OF THE INVENTION

The invention relates to integrated circuit chip testing. Typically, integrated circuit chips are attached to a chip carrier, thermally conductive module chip carrier, circuit card or board, e.g., by solder bonding, brazing, controlled collapse chip connect, wire lead bonding, metal bump bonding, tape automated bonding, or the like. For the first time since the wafer was diced, the chip is tested, e.g., electrically tested and logically tested. Some of the tests are subtle, for example tests for active and passive pattern faults and "stuck at 1" or "stuck at 0" faults. When a fault is found, the chip is removed from the card or board. This is not a simple "desoldering" step, especially in the case of high I/O density integrated circuit chips, bonded with encapsulation chip connect technologies, and usually present in multi-chip modules. This is because when a chip is found to be defective, it must be removed, the chip site redressed, and a new chip installed for testing. In the case of a polymeric substrate, redressing the chip site might include milling.

The chip tester of the present invention substantially reduces the need for expensive rework. According to the method of the invention, there is provided a method of testing semi-conductor chips. The individual semi-conductor chips have I/O, power, and ground contacts. In the method of the invention a test fixture system is provided. The test fixture system includes a dedicated fixture just for testing chips, a chip insertion tool, a chip positioning tool, and a chip removal tool. The functions of the individual tools, that is, the chip insertion tool, the chip positioning tool, and the chip removal tool, may be combined into a smaller set of tools. This chip test fixture system has contacts corresponding to the contacts on the semiconductor chip. The carrier contacts are low electrical contact resistance contacts adapted for holding the integrated circuit chip in place during testing, with low impedance, while allowing easy removal of the chips after testing.

According to the invention the test fixture contacts have dendritic surfaces. By dendrites are meant essentially vertical members extending outwardly from a generally planar area of electrically conductive material. The dendrites, produced by a columnar growth process, generally have an aspect ratio, of vertical to horizontal dimensions, of at least about 1.0, a height above the planar area of electrically conductive material of about 10 to 100 micrometers.

The chip contacts are brought into electrically conductive contact with the dendrite bearing conductor pads on the chip test fixture system. Electrically conductive contact requires a low impedance, low contact resistance contact, with the integrated circuit chips being secured from lateral movement with respect to the substrate or fixture. Test signal input vectors are applied to the inputs of the semiconductor chip, and output signal vectors are recovered from the semiconductor chip. In preferred embodiment of the invention chip testing may be accelerated by heating the integrated circuit semiconductor chip or chips under test.

The chips are removed from the fixture and either discarded or attached to a suitable substrate.

BACKGROUND OF THE INVENTION

In the population of integrated circuit chip carriers, including thermal conductive modules, ceramic substrates, and polymeric substrates, it is necessary to minimize the shipment of modules with defective integrated circuit chips, while minimizing the cost of testing and replacement.

Integrated circuit are subjected to various wafer level tests during various stages of fabrication prior to dicing. However, after dicing it is particularly difficult and expensive to test integrated circuit chips. One reason is that an integrated circuit chip must be tested through its pins and pads before populating of the carrier, card, board, or the like.

In populating a card, board or other packages integrated circuit chips are attached to a circuit card or board, e.g., by solder bonding, controlled collapse chip connect, wire lead bonding, or the like. The chip is then tested as part of an assembly, e.g., electrically tested and logically tested. Some of the tests are subtle, for example tests for active and passive pattern faults and "stuck at 1" or "stuck at 0" faults. When a fault is found, the chip is removed from the card or board. This is not a simple "desoldering" step, especially in the case of high I/O density chips, encapsulation chip connect technologies, and multi-chip modules, where the chip must be removed, the chip site redressed, and a new chip installed for testing. In the case of a polymeric substrate, redressing the chip site might include milling.

DENDRITIC CHIP TESTERS

"High Performance Test System", IBM Technical Disclosure Bulletin, Volume 33, No. 1A (June 1990), pp 124–125 describes a test system for ULSI integrated circuit memory and logic chips. In the described method, a first silicon wafer "test board" has metallization complementary to the metallization of the second silicon wafer to be tested. The second silicon wafer has C4 (controlled collapse chip connection) Pb/Sn solder balls on the contacts. The first and second silicon wafers have substantially flat and substantially parallel surfaces, and are said to require a minimum of compressive force for testing.

Anonymous, "New Products Test Interposer" Research Disclosure, January 1990, Number 309 (Kenneth Mason Publications Ltd., England) describes a method for fabricating an interposer-type test head to perform electrical testing of printed circuit cards and boards prior to component assembly. The test interposer is built as a mirror image circuit of the circuit to be tested. However, only the points to be tested, as lands and pads, are present. Circuit lines are not present. The test interposer pads are coated with a dendritic material to make electrical contact to the corresponding points on the printed circuit component to be tested. The circuit board or card and the tester are then brought into contact for testing.

TESTERS

Compressive type testers are described generally in U.S. Pat. No. 4,716,124 to Yerman et al. for TAPE AUTOMATED MANUFACTURE OF POWER SEMICONDUCTOR DEVICES, U.S. Pat. No. 4,820,976 to Brown for TEST FIXTURE CAPABLE OF ELECTRICALLY TESTING AN INTEGRATED CIRCUIT DIE HAVING A PLANAR ARRAY OF CONTACTS, and U.S. Pat. No. 4,189,825 to Robillard et al. for INTEGRATED TEST AND ASSEMBLY DEVICE.

U.S. Pat. No. 4,189,825 to Robillard et al. for INTEGRATED TEST AND ASSEMBLY DEVICE describes a chip of the beam lead type with sharp points on the substrate leads and etched, conical holes in the semiconductor. The semiconductor and conical holes are metallized with a thin, conformal metal film, leaving conical openings in the metallization. These apertures correspond to the sharp points on the substrate leads. According to Robillard et al, the chips may be assembled and tested, with faulty chips removed and replaced before bonding. Bonding is by ultrasonic welding.

DENDRITIC CONNECTIONS

Dendritic connections are described in commonly assigned U.S. Pat. No. 5,137,461 of Bindra et al for SEPARABLE ELECTRICAL CONNECTION TECHNOLOGY. Bindra et al describe separable and reconnectable electrical connections for electrical equipment. Bindra et al's connectors have dendrites characterized by an elongated, cylindrical morphology. These cylindrical dendrites are prepared by a high frequency, high voltage, high current density, pulse plating methodology utilizing a dilute electrolyte. Bindra et al describe the pulsed electrodeposition of Pd from a 10–150 millimolar Pd tetramine chloride, 5 molar ammonium chloride solution at 50 to 450 hertz and 200 to 1100 milliamperes per square centimeter in a pulse plating technique.

Electrodeposition of Pd dendrites is further described in European Patent 0054695 and U.S. Pat. No. 4,328,286 (European Patent 0020020)

U.S. Pat. No. 4,328,286 (European Patent 20020) to Crosby for ELECTROPLATING A SUBSTRATE WITH TWO LAYERS OF PALLADIUM describes producing a low porosity Pd coating for electrical contacts. The Pd coating is prepared by electrodepositing a first layer of Pd from an aqueous bath containing the cationic complex Pd $(NH_3)_4^{++}$ and free ammonia with supporting anions ($Cl^-$, $Br^-$, $NH_2SO_3^-$, $NO_2^-$ and $NO_3^-$) and then electrodepositing a second Pd layer from an aqueous bath containing the anionic complex $Pd(NO_2)_2^{4-}$ with supporting cations.

Commonly assigned European Patent 54695 (published Jun. 30, 1982, granted Sep. 11, 1985, U.S. application Ser. No. 219660 filed Dec. 24, 1980) discloses a method of preparing a Pd electrical contact by electrodeposition from a relatively dilute solution that is sprayed onto a cathode which is located completely outside and above the surface of the solution, which is located in a tank. The solution forms a continuous curtain falling from the bottom end of the cathode back into the tank. A higher electric current than usual is used in the deposition process. The dendrites obtained have a larger cross-section than those obtained in conventional processes.

CONCLUSION

The art has failed to provide a means for rapid, reproducible, low cost, high throughput testing of integrated circuit chips.

OBJECTS OF THE INVENTION

It is an object of the invention to provide for rapid, reproducible, low cost, high throughput testing of integrated circuit chips.

It is a further object of the invention to provide a method and apparatus for rapid, reproducible, low cost, high throughput testing of integrated circuit chips.

It is a further object of the invention to provide a method and apparatus for rapid, reproducible, low cost, high throughput testing of integrated circuit chips that allows for easy chip positioning and temporary attachment and easy removal of chips after testing.

SUMMARY OF THE INVENTION

According to the method of the invention, there is provided a method of testing semi-conductor chips. The integrated circuit chips are placed in a test fixture by a special tool, tested in the test fixture under carefully maintained test conditions, and removed to assure no removal damage.

In the method of the invention a chip test fixture system is provided. This chip test fixture system has contacts corresponding to the contacts on the semiconductor chip. The carrier contacts have dendritic surfaces.

The chip contacts are brought into compressive contact with the conductor pads on the chip test fixture system. The chip contacts may be C4 solder balls, solder bumps, brazing alloy bumps, metal pads or bumps, as gold, silver, copper, or aluminum bumps or pads, wire lead connection pads, or tape automated bonding connection pads. The compressive contact between the dendritic surface and the chip contacts appears to deform the chip contact surface and provide a highly electrically conductive temporary bond. Test signal input vectors are applied to the inputs of the semiconductor chip across these highly electrically conductive bonds, and output signal vectors are recovered from the semiconductor chip across these highly conductive bonds.

After testing the temporary bonds are broken without damage to the chip or chip contacts, and the chip is carefully removed from the test fixture.

As used herein, "dendrites" are high surface area electrically conductive pads and contacts formed of essentially vertical members extending outwardly from a generally planar area of electrically conductive material. The dendrites, produced by a columnar growth process, generally have an aspect ratio, of vertical to horizontal dimensions, of at least about 1.0, a height above the planar area of electrically conductive material of about 10 to 100 micrometers.

The dendritic morphology is obtained by electroplating the underlayer under conditions that give rise to columnar growth, that is, very low cation concentration in the electrolyte, with electroplating being carried out at a high voltage, a high current, and a high current density. Preferably the electroplating current is a pulsed current.

The resulting dendrites have a peak height of about 10 to 100 microns and a density (dendrites per unit area) of about 200 to 500 dendrites per square millimeter. Dendrites have a chip connect pad to dendritic pad contact resistance of about 3 to 5 milliohms.

THE FIGURES

The invention may be understood by reference to the FIGURES.

FIG. 1 is a representation of dendritic connectors, shown in cutaway view.

FIG. 2 is a flow chart of the method of the invention.

FIGS. 7A and 7B show one embodiment of a chip insertion and compression device useful in the system and method of the invention.

FIGS. 8A and 8B show an alternative embodiment of another chip insertion and compression device also useful in the system and method of the invention.

FIG. 9 shows a device for sequentially applying vacuum and pressure to remove an integrated circuit chip from a burn in board tester.

Figure 14A:
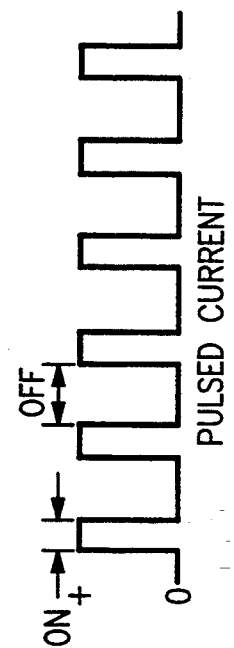
Figure 14B:
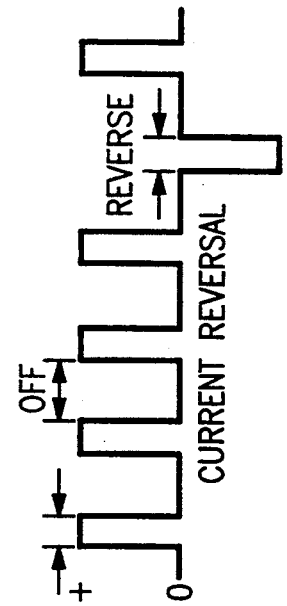

FIGS. 14A and 14B show the voltage versus time plots for pulsed electroplating. FIG. 14A is a representation of the voltage versus time for the "on/off" electroplating method of the prior art. FIG. 14B is a representation of the voltage versus time plot for the reversal method of a preferred embodiment of the invention herein.

DETAILED DESCRIPTION OF THE INVENTION

According to the method of the invention, there is provided a method of testing semiconductor chips. In a preferred embodiment of the invention, there is provided apparatus for placing semiconductor chips in the tester, positioning and holding the semi-conductor chips during testing, and removing the semiconductor chips after testing. The individual semiconductor chips have I/O, power, and ground contacts. In the method of the invention a chip test fixture system is provided. The chip test fixture system includes a burn in board with dendritic chip connectors, a means for placing the integrated circuit chips on the burn in board tester, a means for applying heat and compressive force to the integrated circuit chips under test, and a means for removing the integrated circuit chips from the burn in board tester after completion of the test.

The burn in board of the integrated circuit chip test fixture and system has contacts corresponding to the contacts on the semiconductor integrated circuit chip. The test fixture contacts have surface area electrically conductive surfaces, as columnar dendritic surfaces or polymer core conical connector surfaces.

The chip contacts are brought into electrically conductive contact with the conductor pads on the chip test fixture system. In the case of flip chip connector chips, the chips are tested in their normal, connector down, configuration. In the case of chips intended for other mounting technologies, with their contacts on the top surface, as tape automated bonding chips or wire lead connector chips, the chips can be mounted for testing in an inverted configuration, with their contacts facing downward. Test signal input vectors are applied to the inputs of the semiconductor chip, and output signal vectors are recovered from the semiconductor chip.

After testing the chip may be removed from the substrate.

According to a preferred exemplification of the invention there is provided a method and apparatus for testing an integrated circuit semi-conductor chip. The chip or chips under test may be chips with bottom surface electrical connection, which are characterized as "flip chip" bondable chips. Alternatively, the chips may be conventional chips with upward facing connectors. The chips have a first plurality of I/O, power, and ground contacts. These contacts are typically chosen from the group consisting of solder, low melting point alloys having a melting point below 200 degrees Celsius, solder balls, brazing alloy bumps and balls, contacts of conductive metals as gold, silver, copper, or aluminum, controlled collapse chip connector (C4) balls, and pads for wire lead bonding and tape automated bonding. Generally, the chip connectors are characterized as being a structure formed of a metallic material in which electrical contact resistance is reduced by abrasion or penetration by the test pad material. The chip connectors may be on the bottom surface of the chip, as in "flip chip" bonding, or on the top surface of the chip, as in tape automated bonding or wire liead bonding, or the like.

The process of the invention starts by providing an integrated circuit chip test system having a special and unique burn in board tester. The tester has a second plurality of contacts corresponding to the first plurality of contacts. This second plurality of contacts, i.e., the contacts on the burn in board tester, have high surface area conductor surfaces. Exemplary are columnar dendrites of porous, columnar Pd atop a smooth Pd film. The burn in board also has signal lines for supplying test signals to the second plurality of contacts and then to the contacts on the integrated circuit chips.

The system includes fixtures for placing the integrated circuit semiconductor chip on the burn in board tester, applying a compressive force to the integrated circuit semiconductor chip, and removing the integrated circuit semiconductor chip from the burn in board at the conclusion of the test.

The system may, and preferably does, include one or more heating systems. For example, a resistance heater can be integral to and incorporated into the burn in board tester, as well as heating elements in the compressive means. These heating systems heat the semi-conductor chips under test. Heating the semiconductor integrated circuit chip under test accelerates incipient failures and also accelerates the testing process.

In conducting the tests the first plurality of contacts of the semi-conductor chip are brought into electrically conductive contact with the second plurality of contacts on the chip test fixture system. This is not a simple touching contact. This is a compressive contact to break through oxide films on the contacts, and to even temporarily bond or adhere the contacts.

The compressive force applied to the chip breaks through these oxides and results in low impedance, adherent contact between the first plurality of contacts on the integrated circuit semiconductor chip and the second plurality of contacts on the burn in board tester.

The functional test of the semiconductor integrated circuit chip includes passing test signal input vectors to the semiconductor chip and receiving test signal output vectors from the semiconductor chip, as will be described more fully hereinbelow.

After completion of the test it is necessary to apply a vacuum to the surface of the integrated circuit semiconductor chip remote from the burn in board tester and a positive pressure between the burn in board tester and the integrated circuit semiconductor chip, there being a standoff between the bottom of the chip and the top surface of the burn in board tester, to break the adhesion between the first plurality of contacts on the integrated circuit semiconductor chip and the second plurality of contacts on the burn in board tester. This makes it possible to remove the integrated circuit semiconductor chip from the burn in board tester.

After testing the chips that have passed are separated from chips that have failed. According to a further embodiment of the invention, "fast" chips can be separated from "slow" chips.

DENDRITES

Dendrites are high surface area connectors. They can be used as "pad on pad" connectors, and for chip burn in. Dendrites have the structure shown in FIG. 1, with (a) a electrically conductive pad or substrate, such as a Cu pad, (b) a "smooth" underlayer, as a smooth Pd underlayer, and (c) a porous over layer, as porous Pd layer. The substrate underlying the electrically conductive pad can be a printed circuit board, a metallized ceramic, or a metal pad on a flexible circuit. The underlayer can be a Pd thin film, e.g., a Pd layer direct current plated from a relatively concentrated electroplated bath. The outer layer is a porous, columnar Pd layer, typically deposited from a dilute electroplating solution, with a pulsed, high voltage, high current, high current density electroplating solution. There may, optionally, be a gold layer, or a solder layer, as a Bi—Sn or Pb—Sn layer, atop the porous Pd layer for bonding.

The dendritic morphology is obtained by electroplating the underlayer under conditions that give rise to columnar growth, that is, very low cation concentration in the electrolyte, with electroplating being carried out at a high voltage, a high current, and a high current density. Preferably the electroplating current is a pulsed current. In the case of a particularly preferred embodiment of the invention the plating current is pulsed positive and negative.

The dendritic surface is prepared by first electroplating a smooth Pd coating, referred to in the electroplating as a shiny or reflective plate, onto Cu pads. This smooth Pd layer is deposited from a relatively concentrated Pd electroplating solution, containing about 100 or more millimoles of Pd or more, at a low current density of about 50 to 100 milliamperes per square centimeter or lower.

A columnar, porous Pd layer is applied atop the Pd undercoat. This columnar, porous coat is applied from a relatively dilute Pd electroplating solution having a Pd concentration of about 10–50 millimoles per liter in Pd (versus about 100 millimoles of Pd per liter for conventional electroplating). Typical electroplating solutions include palladium tetra-amine chloride/ ammonium chloride, at a pH of about 9 to 10. Typical pulsed electroplating programs include a ten to twenty percent duty cycle, and a current density of about 500 to 1000 mA/cm$^2$.

While satisfactory results are obtained with a single phase pulsed current, as shown in FIG. 14A, and denominated "Prior Art," we have found that superior results are obtained with about 2.5 percent to about 25% voltage reversal with a two phase electroplating cycle, as shown in FIG. 14B. By "single phase" pulsed electroplating cycle, we mean an electroplating current that is pulsed to zero and positive values. By a "two phase" pulsed electroplating cycle we mean an electroplating current that is pulsed to zero and positive values and to zero and negative values, as shown in FIG. 14B.

One such pulse pattern that we have found particularly outstanding has the following characteristics:

| POSITIVE PULSE CONDITIONS | |
|---|---|
| Peak Current Density | 200–400 Amperes/ft$^2$ |
| Pulse Time On | 0.5 to 1.0 millisecond |
| Pulse Time Off | 2.0 to 9.0 milliseconds |
| Duty Cycle | 10% to 20% |
| Positive Direction Time | 20 to 40 seconds |
| REVERSE PULSE CONDITIONS | |
| Peak Current Density | 300 to 800 Amperes/ft$^2$ |
| Pulse Time On | 0.5 to 1.0 millisecond |
| Pulse Time Off | 2.0 to 9.0 milliseconds |
| Duty Cycle | 10% to 20% |
| Reverse Direction Time | 1 to 5 seconds |

Gold, solder (as Pb—Sn or Bi—Sn) or even a thin overcoat of Pd may be applied atop the dendrites formed thereby.

The resulting dendrites have a peak height of about 10 to 100 microns and a density (dendrites per unit area) of about 200 to 500 dendrites per square millimeter. Dendrites have a chip connect pad to dendritic pad contact resistance of about 3 to 5 milliohms.

While the invention has been described with respect to dendrites, it is, of course, to be understood that conical connectors may also be utilized on the substrate or fixture. Conical connectors are described in the commonly assigned U.S. Pat. No. 5,118,299 of Francis C. Burns, John J. Kaufman, David E. King, and Alan D. Knight, for CONE ELECTRICAL CONTACT, the disclosure of which is hereby incorporated herein by reference. Conical connectors are prepared by depositing an imagable polymeric material, as polyimide, and forming polymeric cones, as by laser ablation. The conical connectors are then coated, e.g., e.g., with a sputter chromium adhesion layer approximately 150 Angstroms thick, followed by sputter coating of a Cu layer approximately 10,000 to 100,000 Angstroms thick. A nickel coating approximately 0.1 to 1 mil thick is deposited atop the Cu, followed by a thin Au film.

INTEGRATED CIRCUIT CHIP BURN IN TEST SYSTEM

In a preferred exemplification of the invention the system includes:

1. A burn in board with dendritic pads for connecting to C4 solder balls on one or more integrated circuit chips to be tested;

2. A heating assembly, preferably a time versus temperature programmable heating assembly, for heating the one or more integrated circuit chips being tested; and 3. Sub-systems for placing the integrated circuit chip or chips on the burn in board, and for removing the integrated circuits from the burn in board tester at the conclusion of testing.

It is, of course, to be understood that the heating assembly, the subsystem for inserting the integrated circuit chips, and the subsystem for removing the integrated circuit chips at the conclusion of testing can be one unit, fixture, tool, or element.

The burn in board has a plurality of individual pads, lands, or recesses for temporary electrical connectivity with integrated circuit chips. Each such pad, land, or recess has dendrites or cones, as described hereinbelow, to pierce the thin oxide layer on each facing contact of the integrated circuit chip, as a Pb/Sn solder ball, and provide a low contact resistance electrical connection between the pad, land, or recess, and the contact on the integrated circuit chip.

The chips are manually or robotically located and placed on the burn in board so that each contact of each chip mates with a land, pad, or recess of the burn in board.

In one embodiment of the invention the heating assembly is aligned over the array of integrated circuit chips and lowered over the integrated circuit chips to cover the chips, apply heat to the chips, and apply a compressive force thereto. This application of pressure increases the heat transfer between the heating assembly and the chips, and reduces the electrical contact resistance between the integrated circuit chip contacts and the burn in board.

In a preferred exemplification the heating assembly has recesses for each integrated circuit chip. Each such recess has its sidewalls thermally insulated to prevent loss of heat from an individual chip to adjacent chips, thereby further increasing the severity of the test.

In a particularly preferred embodiment the burn in board itself can have integral heating means, whereby to heat the integrated circuit chips from both the top and bottom surfaces of the integrated circuit chip.

The temperatures may be monitored at each chip location, as well as at various other locations to control the thermal load on a chip.

FIG. 2 is a flow chart of the method of the invention.

Figure 3:
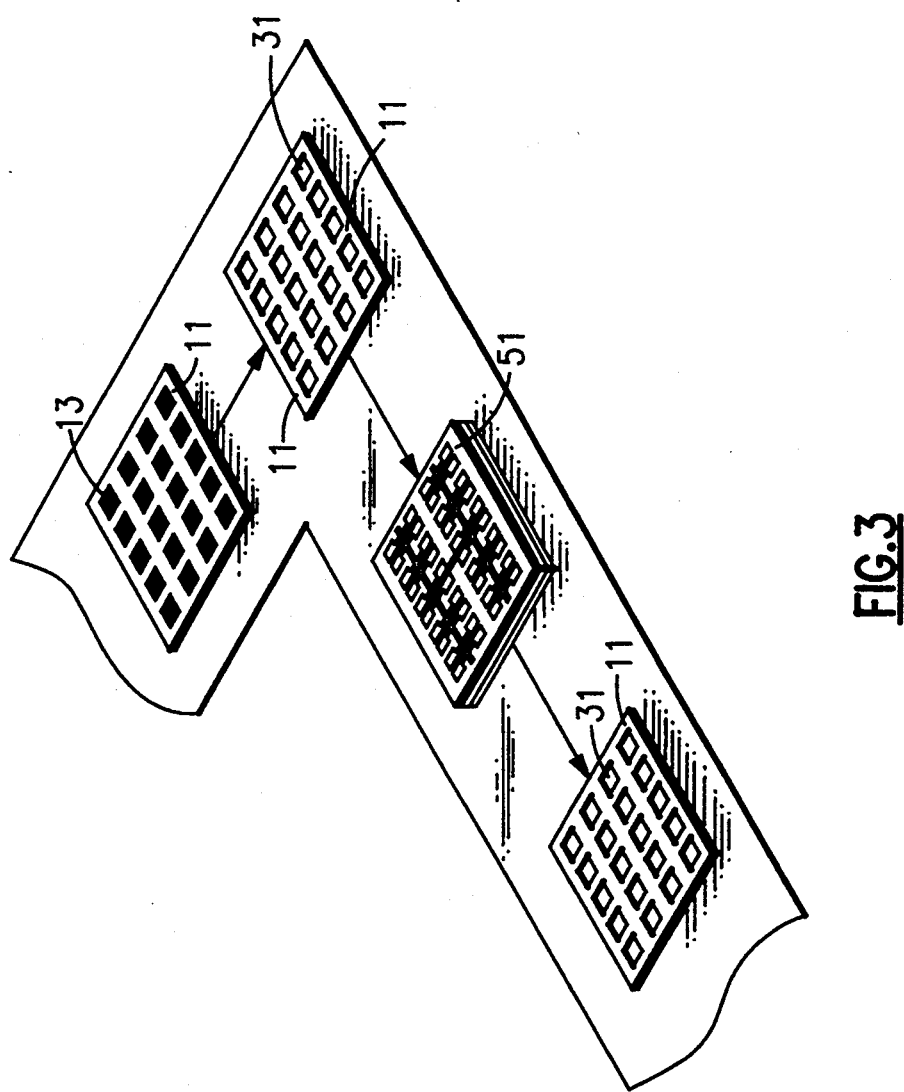
FIG. 3 is a schematic flow chart of the method of the invention, showing an overview of both the process and the system of the invention.

FIG. 3 is a schematic flow chart of the method of the invention, showing an overview of both the general system and the process. An initially unpopulated burn in board 11 is populated with integrated circuit chips 31, either normally configured "flip chip" bonding chips, or inverted chips with contacts on their top surface. A heating assembly 51 is applied to the integrated circuit chips 31 on the burn in board 11 to provide electrical contact between the integrated circuit chips 31 and the contacts 13 on the burn in board 11. The integrated circuit chips 31 are then tested electrically, logically, and thermally, as described hereinbelow. After testing the heating element 51 is removed from the integrated circuit chips 31 and the burn in board 11 and the individual integrated circuit chips 31 are separated into defective chips and chips for placement on a printed circuit board, card, or other substrate.

Figure 4:
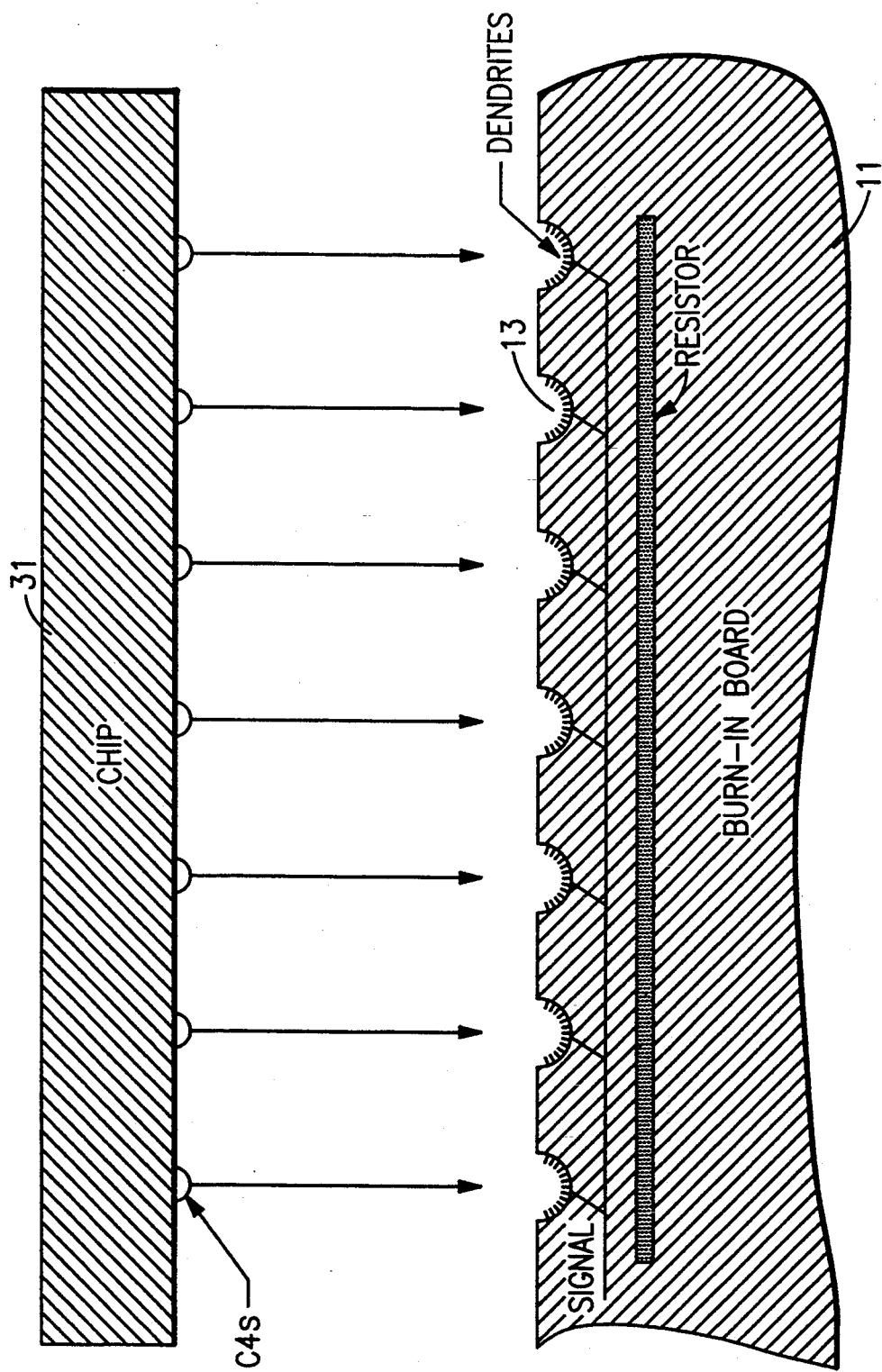
FIG. 4 is a partial cutaway view of the burn in board tester of the invention.

FIG. 4 is a partial cutaway perspective view of the burn in board 11. This shows individual dendritic contacts 13 on the surface of the burn in board, with electrical contacts for applying test vectors to individual contacts of the integrated circuit chip. Also shown is an optional heating means 15, represented by a resistance heater.

Figure 5:
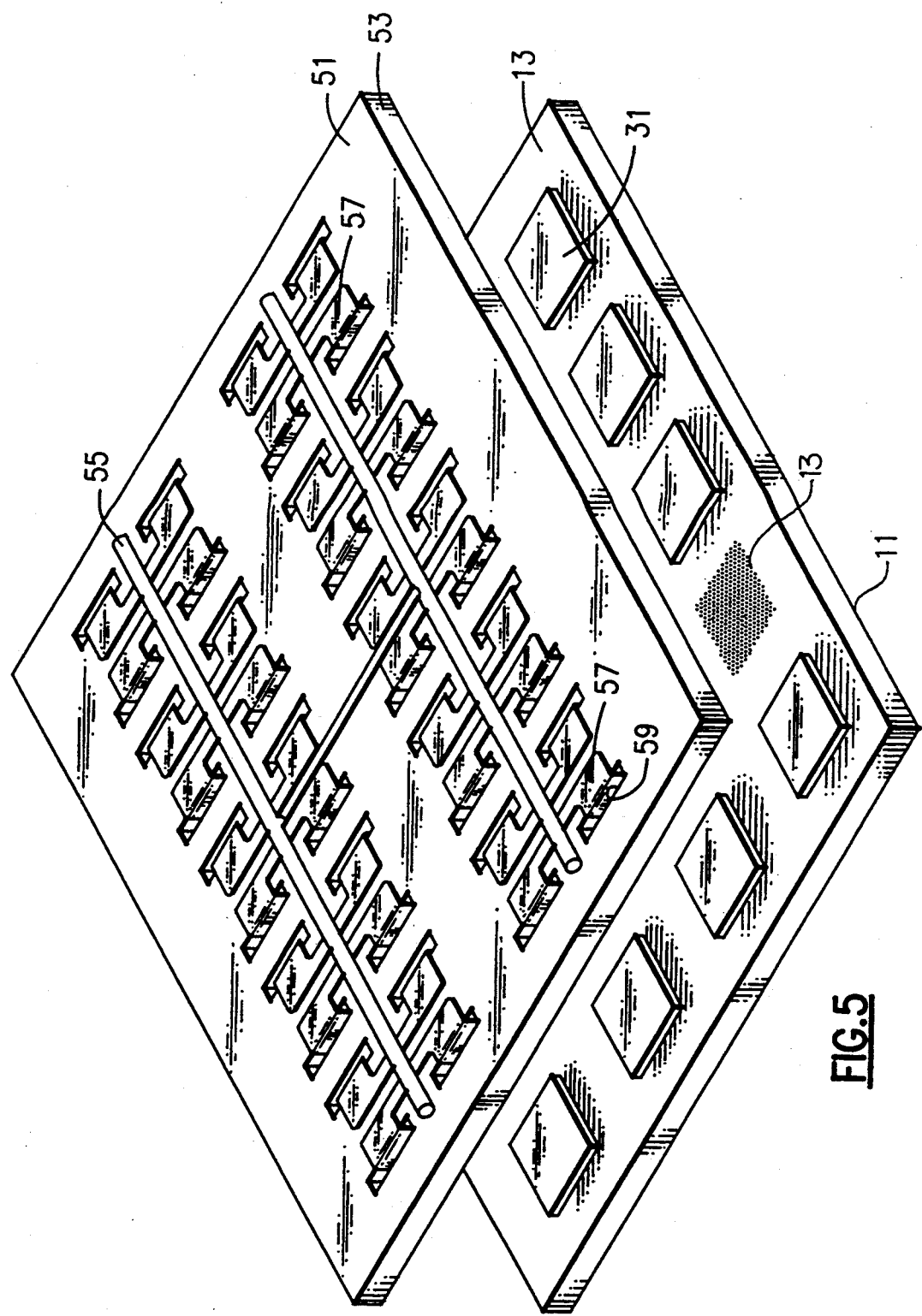
FIG. 5 is a perspective view of a heating assembly useful in the method and system of the invention.

FIG. 5 is a perspective view of the heating assembly 51 showing the assembly 51 with respect to the populated burn in board 11. In the embodiment shown in FIG. 5, the heating assembly has a board 53 with a power cable 55, connected to individual feeder cables 57 which extend through slots 59 to heating elements (not shown) atop the integrated circuit chips 31.

Figure 6:
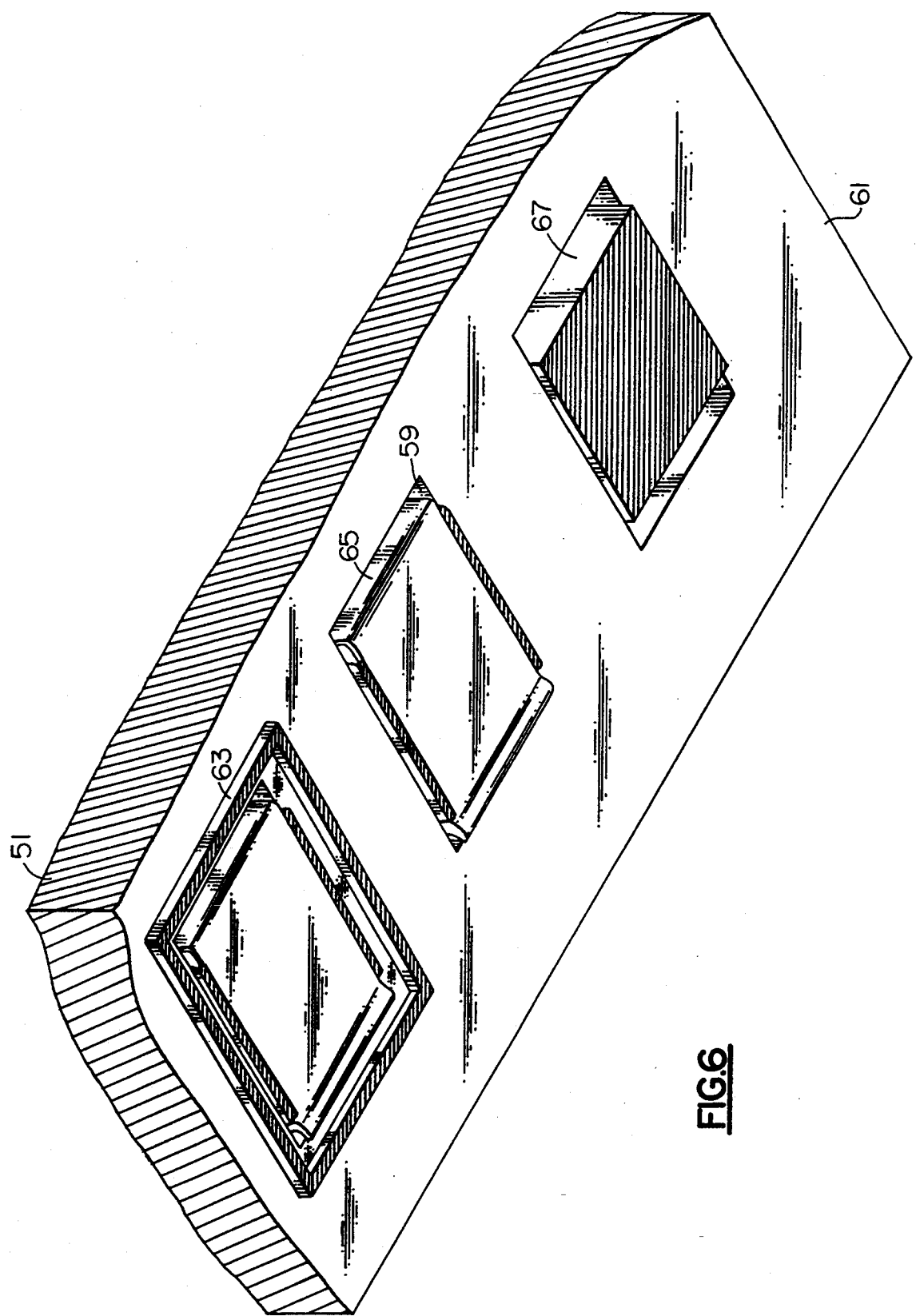
FIG. 6 is a perspective view of the bottom surface of the heating assembly shown in FIG. 5.

FIG. 6 is a perspective view of the bottom surface 61 of the heating assembly shown in FIG. 5. This view shows individual apertures 59 for the individual integrated circuit chips 31. A heat frame 63 surrounds each aperture 59, with a conformal heater 65 wrapped around the walls of the aperture 57 and a conformal contact pad 67. The conformal contact pad 67 may be formed of a resilient material, optionally with heating means contained therein.

The testing process requires initial high pressure to break through oxide films on the connector contact surface and effect a low electrical resistance contact, as well as sustained high pressure to avoid oxide formation and loss of electrical contact surface area, thereby reducing contact resistance and providing good electrical interconnection between the burn in board tester 11 and the integrated circuit chips 31 under test. Moreover, it is essential that the integrated circuit chip be held in place with a predetermined and controllable force, for example a chip specific force, a test fixture specific force, or a test procedure specific force. Chip specific forces can be the product of the number and type of I/O's, as the number of C4 connectors or the quantity of solder bump connections on the integrated circuit chips.

Thus it is necessary to apply force to the load bearing surfaces opposite the electrical contact surfaces of the integrated circuit chips 31 to both insert the chips 31 before testing and to retain the chips 31 during testing. This can be accomplished an integrated chip retention fixture. One such fixture is shown in FIGS. 7A and 7B, while another such fixture is shown in FIGS. 8A and 8B.

One type of chip retention fixture 91 for applying a compressive force to the chips 31 under test applies a non-variable, predetermined force to the integrated circuit chip 31 or chips 31 under test is shown in FIGS. 7A and 7B. The amount of force is determined by a weight or a spring. The fixture 91 has four major elements, means 95 for alignment of the integrated circuit chip 31 and the fixture 11 on the burn in board tester 11, means 101 for retaining the fixture 91 on the burn in board tester 11, means 111 to apply force to the integrated circuit chip 31 under test, and means 116 for placing and removing the fixture 91 with respect to the integrated circuit chip 31 under test and the burn in board tester 11.

The exemplification shown in FIGS. 7A and 7B has vertical guides 96 to align the fixture 91 to the burn in board tester 11. The guides or tabs 96 are orthogonal to the burn in board tester 11.

The means 105 for applying force to the integrated circuit chip 31 can be a flexible beam 106 that traverses the fixture 91 and the site of the integrated circuit chip 31. The means 105 for applying force also includes a body portion 107 adapted for directly applying a compressive force to the integrated circuit chip 31 under test. The body portion 107 can be a foot, a weight or a chip swivel. Alternatively, the body portion can be a piston, including a gas pressure driven piston, a spring driven piston, or a vacuum drawn piston.

The chip contacting face 108 of the means 105 for applying a compressive force to the integrated circuit chip 31 is flat, but can have a degree of movement to allow it to sit flat on the back of the integrated circuit chip 31, thereby applying force evenly to the integrated circuit chip 31.

The means 95 for aligning the fixture 91 on the burn in board tester 11 and placing and removing the fixture 91 from the burn in board tester 11 can take various forms. FIGS. 7A and 7B show an embodiment where there are two burn in board retainer tabs 96. The tabs 96 are shaped, e.g., "L" shaped, to lock to the bottom 12 of the burn in board tester 11. The fixture 91 of FIGS. 7A and 7B also has a pair of load/unload actuators 97. These actuators provide the bending arm for opening the retainer tabs 96 when placing and removing the fixture 91.

An alternative fixture is shown in FIGS. 8A and 8B. This design applies a continuous force to the back of the integrated circuit chip 31 or chips 31 under test. The base of the fixture shown in FIGS. 8A and 8B contains retention slots 121, for example, two retention slots 121, dimensioned to hold the burn in board tester 11 and the integrated circuit chips 31 under test. For the fixture 91 shown in FIGS. 8A and 8B, the compressive force is controllably applied using a threaded shaft 123 with a flat end 125. The torque force is applied to the integrated circuit chip 31 or chips 31 under test with an adjustable torque limit detente limit system.

While the chip insertion and retention fixtures of FIGS. 7A, 7B, 8A, and 8B are shown as separate fixtures from the heating assembly of FIGS. 5, and 6, means for the controllable application of pressure to the integrated circuit chips 31 may be incorporated therein, with means for controllably applying pressure to the conformal heating pads 67. The means for applying pressure to the conformal heating pads 67 may be fixed pressure means, as shown in FIGS. 7A and 7B, or controllable pressure means as shown in FIGS. 8A and 8B, or even gas pressure and vacuum means, as shown in FIG. 9 and described more fully hereinbelow.

Because, as noted above, the testing process requires initial high pressure to break through oxide films on the surface of the solder balls and contacts, as well as sustained high pressure to reduce contact resistance and provide good electrical interconnection between the burn in board and the integrated circuit chip, there may be adhesion of the integrated circuit chips 31 under test to the burn in board tester. Moreover, during testing thermal energy is both generated within the individual integrated circuit chips 31 and applied to the chips. This can, and frequently does, result in adhesion and even bonding of contacts between the individual integrated circuit chips 31 and the burn in board 11. In order to avoid damaging the individual integrated circuit chips 31, especially after the application of sufficient force thereto to break any oxide films on the surface of the solder balls or other interconnects, and the continued application of mechanical force, electrical energy, and heat, it is frequently necessary to use a special tool to remove the integrated circuit chips 31 from the burn in board 11.

One such fixture is shown in FIG. 9. The device 131 is fabricated of a rigid material. The device has both an integral vacuum line 133 and an integral high pressure line 135, communicating to external vacuum and pressure sources, 137 and 139 respectively, optionally through movable inserts 141 and 143 respectively. The tool 131 has a vacuum recess 145 with an outer perimeter 147 larger then the integrated circuit chip 31 and an inner recess 149 of smaller size, i.e., smaller length, and width, but greater height or depth, then the individual integrated circuit chip 31. An "O" ring 151 provides an outer seal around the integrated circuit chip 31.

Figure 10:
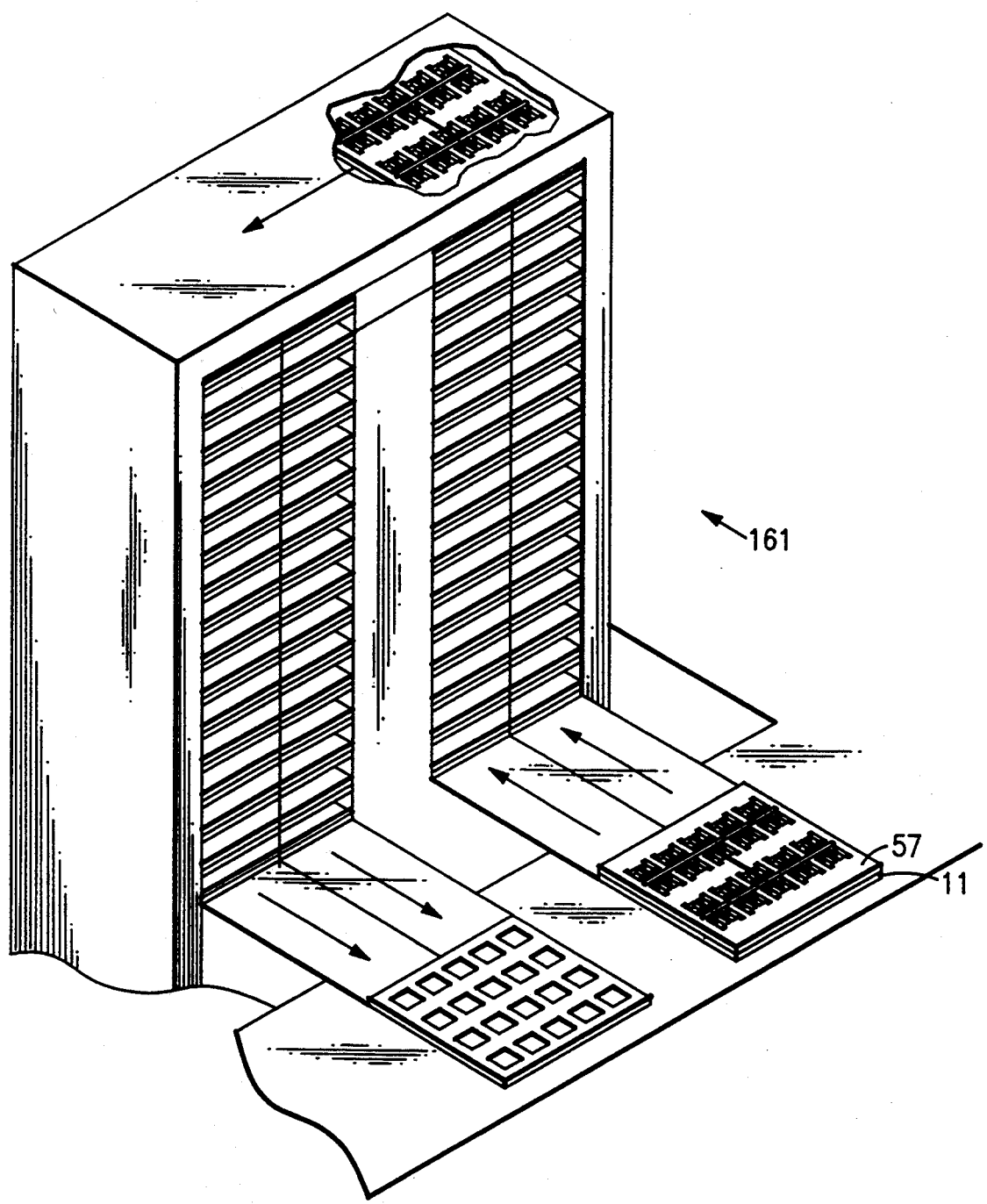
FIG. 10 shows a multiple burn in board tester.

FIG. 10 shows a perspective view of a further embodiment of the invention where a plurality of burn in boards are inserted in a large tester 161. The individual burn in boards 11 connect to connectors inside the container 161, while the individual heating elements 51 connect to separate higher wattage contacts (not shown).

INTEGRATED CIRCUIT CHIP TEST PROCEDURES (TEST FIXTURE)

FIG. 2 shows an overview of the general system and process. An initially unpopulated burn in board 11 is populated with integrated circuit chips 31. The integrated circuit chip is tested substantially as shown in FIG. 2. The integrated circuit chip, with connectors on its substrate facing is positioned on the test fixture. In a preferred embodiment the chip contacts or connectors on the chip bonding surface are selected from the group consisting of solder, low melting point alloys having a melting point below 200 degrees Celsius, solder balls, brazing alloy bumps and balls, contacts of conductive metals as gold, silver, copper, or aluminum, controlled collapse chip connector (C4) balls, and pads for wire lead bonding and tape automated bonding thereon for subsequent bonding to a substrate.

The burn in board fixture 31 has dendrites on the chip connect surfaces, contacts, or pads, substantially as described above. The chip 31 and burn in board 11 are brought into contact and a compressive force is applied to the chip 31 and burn in board 11. The compressive force is sufficient to allow the dendrites to break through any oxide or corrosion films on the solder balls or C4 connectors on the chip. This provides direct, metal to metal contact, characterized by a contact resistance of less then 10 milliohms, and preferably less than 6 milliohms.

When the integrated circuit chip retention fixture 91 of FIGS. 7A and 7B is utilized, loading and removal can be either manual, semi-automatic, or fully-automatic, including robotic. Both placing and removing the fixture 91 includes squeezing the upper portions of the load/unload actuators 97 to force the burn in board tester retainer tabs 96 wide enough apart to clear the burn in board chip tester 11. Allowing the burn in board tester tabs 96 to return together locks the fixture 91 in place, and applies a compressive force to the integrated circuit chip 31 under test.

Loading and removing the alternative integrated circuit chip retention fixture of FIGS. 8A and 8B includes loading the burn in board tester 11 into the retention slots 121, and positioning the fixture 91 so that the pistons are directly above the integrated circuit chips 31 under test. After the fixture 91 is properly centered, the knurled detente head is turned clockwise until the pre-calibrated detente pin is released from its recess.

A heating assembly 51, which may also be the compressive tool 91, is applied to the integrated circuit chips 31 on the burn in board 11 to provide electrical contact between the integrated circuit chips 31 and the contacts 13 on the burn in board 11. The chips are then tested electrically, logically, and thermally, as described hereinbelow.

Generally, in the testing process the integrated circuit chip is powered, e.g., between inputs of $V_{DD}$ or $V_{CC}$, and Ground, and subjected to various logic and memory tests and to thermal loads. Chips that fail to pass these tests are discarded, while chips that pass these qualification tests are installed in systems.

After testing the heating element 51 is removed from the chips 31 and the burn in board 11 and the individual integrated circuit chips are separated into defective chips and chips for placement on a printed circuit board, card, or other substrate.

As noted hereinabove, the testing process subjects the integrated circuit chip to compressive and thermal loads which, while necessary to break through oxide films on the surface of the solder balls and contacts, reduce contact resistance, and provide good electrical interconnection between the burn in board 11 and the integrated circuit chip 31, which can, and frequently do, result in adhesion and even bonding of contacts between the individual integrated circuit chips 31 and the burn in board 11. Thus, to avoid damaging the individual integrated circuit chips 31, it is may be necessary to use high pressure and vacuum tools to remove the integrated circuit chips 31 from the burn in board 11.

To remove an integrated circuit chip the tool 131 is positioned over the burn in board 11 with the recess 145 located over the integrated circuit chip 31. A vacuum is drawn over the chip 31, and a high pressure, e.g., about 10 to 50 or more pounds per square inch (gauge) is applied through the pressure line 135. The combination of vacuum applied to the top surface of the integrated circuit chip 31 and high pressure applied to the bottom of the integrated circuit chip 31, forces the chip upward from the burn in board tester 11 for easy removal.

INTEGRATED CIRCUIT TEST PROCEDURES (TEST VECTORS)

The integrated circuit chip may be tested for various defects while in dendritic contact with the dendritic surfaced pad. While the description herein is of the type of test procedures normally utilized for memory chips, especially CMOS memory chips, it is, of course, to be understood that the method of this invention is equally applicable to logic integrated circuit chips, and even to analog integrated circuit chips, as power processing chips and amplifier chips.

In the case of memory chips, the chip or chips may be tested for "cell stuck" faults. In a "cell stuck at" fault, one or more cells or gates are stuck-at-1 or stuck-at-0. When a cell or gate is stuck-at-x, it will remain stuck-at-x regardless of what is done to the cell or to surrounding cells or gates.

Memory chips have a decoder. The decoder is the combinational circuit that selects a unique memory word corresponding to an address. Failures in decoder logic result in "no access faults" and in "multiple access faults." In "no access faults" the decoder will not address the accessed cell. The decoder may address non-addressed cells. In "multiple access faults" the decoder will address multiple cells, possibly including the addressed cell. *

"No access" faults are similar to "stuck-at-x" faults except that the failure is in the decoder and not the memory array, and "multiple access" faults are similar to "coupling" or "pattern sensitive" faults, except, again, the failure is in the decoder and not the memory array.

Integrated circuits are also susceptible to pattern sensitive faults. Pattern sensitive faults exist when cells are "coupled." Cells are "coupled" when a transition at a cell, due to a write operation at this cell, changes the contents of a second cell, independently of the contents of the second cell or of any other cells. Coupling can be uni-directional, i.e., a change the state of cell i can change the state of cell j, but a change of the state of cell j does not change the state of cell i, or bi-directional, i.e., a change of the state of cell i changes the state of cell j, and a change of the state of cell j changes the state of cell i. Typically, pattern sensitive faults are identified with capacitive coupling and leakage currents.

Another class of faults to which integrated circuit chips, especially memory chips, are susceptible to are faults in access circuitry. Accessing faults occur when more then one memory cell is accessed during a READ or WRITE operation. During a READ operation at some address, i,j, more then one cell can be accessed, and the output is some combinatorial function of the contents of both cells. During a write operation at one of the "coupled" addresses, all of the activated or accessed cells are written to simultaneously. Other types of accessing faults occur when the sense amplifier logic or the write driver logic are "stuck at X." These faults may be due to capacitive coupling or due to shorts.

Figure 11:
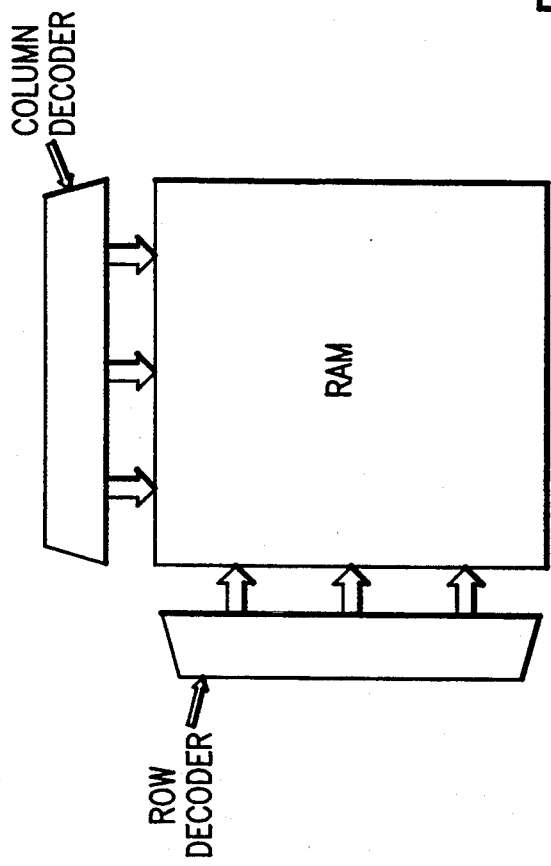
FIG. 11 is a circuit diagram of a RAM and decoder used to illustrate test vectors.

A memory array, with column and row decoders is shown in FIG. 11. Consider a simplified RAM having a 8×4 memory array of 8 rows by 4 words per row. The routine shown below, which requires $4n$ tests (where n is the number of memory cells in the memory array) detects decoder faults and cell "stuck at" faults.

For i=0 to i=n−1
Write ($c_i$, 0)
For i=0 to i=n−1
Read ($c_i$,=0)
Write ($c_i$,=1)
Read ($c_i$,=1)

Another test used in testing CMOS integrated memory circuits is the March Test. The March Test is a finite sequence of March Elements. A March Element is a finite sequence of operations (Read, Write 1. Write 0, Write the complement) applied to every cell in the memory array. The operations can be applied in either increasing address order (from address 0) or in decreasing address order (from address n−1). The same operations are applied to each cell.

There are various procedures for generating the March test pattern. Specifically, one such procedure starts by classifying possible physical defects (shorts, opens, oxide too thin, etc.) likely to effect memory functionality or having a high probability of occurrence.

Next, the circuit is simulated by a circuit simulator, as SPICE or ASTAP. The purpose of this simulation is to determine the impact the effect of the physical defect on the memory. Defects can affect either memory functionality or memory performance.

The faults determined by SPICE or ASTAP simulation are then mapped into specific memory failure modes, that is, "Stuck-At-X" or "Access" or "Coupling" failure modes.

Functional test patterns are then derived from the failure modes. The test patterns are derived to cover all of the failure modes identified for the memory.

The test patterns are then run against the simulator to insure that the test pattern detects defined failure modes.

Most defects are memory cell defects that initially appear as a "Stuck-At-X" defect. However, sometimes a defective cell can drive the entire output of an entire row, or appear as a pattern sensitive fault.

The March Test is particularly preferred for testing the decoder. The March Test tests for cell "stuck at" faults, and it tests for coupling faults. However, the March Test does not test for pattern sensitive faults.

This is because the March test is linearly sequential, and can mask pattern sensitive faults.

In the March Test, the signal pattern is

For $i=0,1,\ldots,n-1$
Write $(c_i, 0)$
For $i=0,1,\ldots,n-1$
Read $(c_i,=0)$
Write $(c_i,=1)$
Read $(c_i,=1)$
For $i=n-1, n-2, \ldots, 0$
Read $(c_i,=1)$
Write $(c_i,=0)$
Read $(c_i,=0)$
Repeat the above steps, interchanging 0's and 1's.

The March Test detects the following faults:

a. Stuck Cell. To detect a "Stuck-At-1" fault in a memory cell, the cell must be initialized to 0, and the value 0 must actually be read. If 0 is read, there is no "Stuck-At-1" fault. Similarly, to detect a "Stuck-At-0" fault in a memory cell, the cell must be initialized to 1, and the value 1 must actually be read. If 1 is read, there is no "Stuck-At-0" fault.

b. No-select on Write. The No select on write fault is a Write Decoder fault. Define $f_0 f_1 f_2 f_3 f_4 f_5 f_6 f_7$ be the memory word not selected as the result of the fault. A necessary and sufficient condition for detecting the No Select On Write fault is that:

i. Write pattern a at word f.
ii. Write and read the complement of pattern a from f. Since the word f can not be selected for a Write operation, the word contains a random pattern. Writing and reading a specific pattern is necessary to detect this failure mode.

c. No Select On Read. This is read decoder failure mode.

d. Write Multiple Words. Let i be the word being addressed and f be the word actually being written as a result of the Write Multiple Words failure. To detect the Write Multiple Words failure, i. should contain the complement of the pattern written at i. This is necessary to distinguish between the patterns at i and f.
ii. The test sequence for each word i should include
   a. Read pattern a at location i.
   b. Write complement of a at location i. This reads the complement data at f before the value in f is destroyed.
   c. Ripple the linear addressing through the memory.

If $f>i$ and conditions i and ii are satisfied, then the fault is detected when addressing in ascending order. If $f<i$ then the fault is detected when addressing is descending order.

e. Read Multiple Words. This failure, also called multiselect, occurs when two words are read simultaneously. In the test for this failure mode the two words i and f should have complementary data. The sense amplifier should be able to discriminate between reading a simultaneous 0 and 1 on the same line, and reading normal 0's and 1's.

f. Shorts Between Read Ports. This is an electrical failure, that can result in a Read To Write Port short, a Write to Read Port Short, or a Write To Write Port Short.

An improved March Test Pattern that can be utilized with the structure and method of the invention is:

1. Initialization to write the background pattern,

For $i=1$ to $n-1$ Write to the $i^{th}$ row a background pattern, $a_i$.

2. Forward ripple. This reads the background pattern and writes the complement, rippling though the address space from 0 to n.

For $i=1$ to $n-1$, read the background pattern, write the complement of the background back into the row, read the row, and increment the row decoder..

3. Reverse ripple. This reads the new background pattern (the complement of the previous contents of the row—hopefully), writes the complement (which is, hopefully, the original background pattern of the row), and ripples through the address space from $n-1$ to o.

For $i=n-1$ to 0, read the contents of the row, write the complement of the row back into the row, and ripple through the address space from $n-1$ to 0.

The method and structure of the invention can be used to test for Pattern Sensitive Faults. Pattern sensitive faults can be passive or active.

Figure 12:
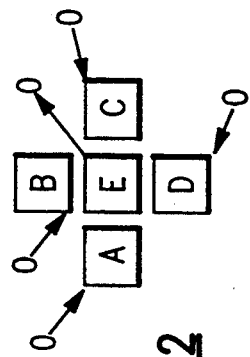
FIG. 12 is a representation of passive faults in a Random Access Memory (RAM) cell.

Passive pattern sensitive faults are faults such that a pattern of cell values prevents writing a value into a cell. A passive pattern sensitive fault pattern is shown in FIG. 12. In the Figure the states of cells, A, B, C, and D determine the state of cell E, that is $A=B=C=D=0=>E=0$.

Figure 13:
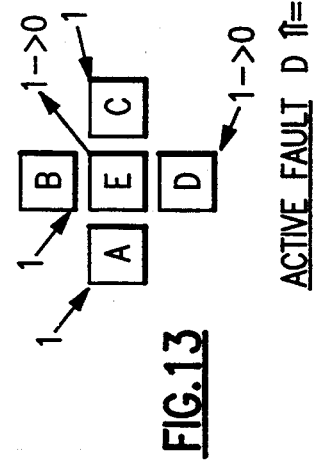
FIG. 13 is a representation of active faults in a Random Access Memory (RAM) cell.

Active pattern sensitive faults occur when the change of value in one memory cell causes the value stored in another cell to change. An active pattern sensitive fault is shown in the FIG. 13, where the contents of cell D determine the contents of cell E. That is, $A=B=C\neq>D$, E, but $D \uparrow => E \uparrow$.

Passive pattern sensitive faults are tested for by setting the contents of the adjacent memory cells, A,B,C,D from $\{0,1\}$, and setting the base cell, E, to $E=\uparrow$ and $E=\downarrow$, and reading the base cell, E. For a passive pattern sensitive fault, we expect the measured value of the contents of cell E to be a function of the contents of the surrounding cells, and not necessarily the value set by the testing program.

In testing for active pattern sensitive faults, we place fixed values in three of the four neighboring cells (i.e., three of the four cells, A,B,C, and D), and the base cell. We then transition the remaining neighbor cell, and see if this changes the contents of the base cell, E.

Testing for passive pattern sensitive faults requires $\sim 65n$ tests, where n is the number of cells. Testing for active pattern sensitive faults requires $100n$ tests, where n is the number of cells.

The above described tests and test procedures may be applied to an integrated circuit chip in an environment more severe then the environment where it is to function in service, along with actual fan-out and latency effects. This is a particular advantage over existing test procedures.

While the invention has been described with respect to certain preferred embodiments and exemplifications hereof, it is not intended to limit the scope of the invention thereby, but solely by the claims appended hereto.

We claim:

1. A method of testing an integrated circuit semi-conductor chip, said chip having a first plurality of I/O, power, and ground contacts, said method comprising the steps of:

a. providing an integrated circuit chip test system comprising:
   (1). a burn in board tester having i. a second plurality of contacts corresponding to said first plurality of contacts, said second plurality of contacts having high surface area conductor surfaces; said conductor surfaces being columnar dendrites comprising columnar Pd atop a Pd film, and having a height of about 10 to 100 microns and a density of about 200 to 500 dendrites per square millimeter; and
   ii. signal line means for supplying test signals to said second plurality of contacts;
  (2). means for placing the integrated circuit semiconductor chip on the burn in board tester, applying a compressive force to the integrated circuit semiconductor chip, and removing the integrated circuit semiconductor ship from the burn in board at the conclusion of the test; and
  (3). heating means for heating semi-conductor chips under test;
 b. bringing the first plurality of contacts of the semi-conductor chip into electrically conductive contact with the second plurality of contacts on the chip test fixture system;
 c. applying a compressive force to the chip to provide low impedance contact between the first plurality of contacts on the integrated circuit semiconductor chip and the second plurality of contacts on the burn in board tester;
 d. passing test signal input vectors to the semiconductor chip and receiving test signal output vectors from the semiconductor chip; and
 e. applying a vacuum to the surface of the integrated circuit semiconductor chip remote from the burn in board tester and a positive pressure between the burn in board tester and the integrated circuit semiconductor chip to remove the integrated circuit semiconductor chip from the burn in board tester; and
 f. separating chips that have passed from chips that have failed.

2. The method of claim 1 wherein the first plurality of contacts of the semi-conductor chip are chosen from the group consisting of solder, low melting point alloys having a melting point below 200 degrees Celsius, solder balls, brazing alloy bumps and balls, contacts of conductive metals as gold, silver, copper, or aluminum, controlled collapse chip connector (C4) balls, and pads for wire lead bonding and tape automated bonding.

3. The method of claim 1 wherein said the columnar Pd is deposited by two phase pulsed electrodeposition.

* * * * *